(12) United States Patent
Ooshika et al.

(10) Patent No.: US 8,735,938 B2
(45) Date of Patent: May 27, 2014

(54) SEMICONDUCTOR DEVICE AND METHOD OF PRODUCING THE SAME

(71) Applicant: Dowa Electronics Materials Co., Ltd., Tokyo (JP)

(72) Inventors: Yoshikazu Ooshika, Tokyo (JP); Tetsuya Matsuura, Tokyo (JP)

(73) Assignee: Dowa Electronics Materials Co., Ltd., Tokyo (JP)

( * ) Notice: Subject to any disclaimer, the term of this patent is extended or adjusted under 35 U.S.C. 154(b) by 0 days.

(21) Appl. No.: 13/933,389

(22) Filed: Jul. 2, 2013

(65) Prior Publication Data

US 2013/0292641 A1 Nov. 7, 2013

Related U.S. Application Data

(63) Continuation of application No. 13/582,235, filed as application No. PCT/JP2011/055172 on Mar. 1, 2011.

(30) Foreign Application Priority Data

Mar. 1, 2010 (JP) .................................. 2010-044520

(51) Int. Cl.
*H01L 29/66* (2006.01)
(52) U.S. Cl.
USPC .......................................................... 257/183
(58) Field of Classification Search
USPC .......................................................... 257/183
See application file for complete search history.

(56) References Cited

U.S. PATENT DOCUMENTS 5,963,787 A 10/1999 Kimura et al.
2008/0054248 A1* 3/2008 Chua et al. ...................... 257/14

FOREIGN PATENT DOCUMENTS

| JP | 10-74980 | | 3/1998 |
|---|---|---|---|
| JP | 11-40891 | | 2/1999 |
| JP | 2000-277803 | | 10/2000 |
| JP | 2000277803 A | * | 10/2000 |
| JP | 2000-332293 | | 11/2000 |
| JP | 2001-77412 | | 3/2001 |
| JP | 2001077412 A | * | 3/2001 |
| JP | 2005-235908 | | 9/2005 |
| JP | 2007-165576 | | 6/2007 |
| JP | 2008-66730 | | 3/2008 |
| JP | 2008-78186 | | 4/2008 |
| JP | 2009-158804 | | 7/2009 |

OTHER PUBLICATIONS

Oct. 4, 2011 Office Action issued in Japanese Patent Application No. 2011-179162 (with translation).
Jan. 10, 2012 Office Action issued in Japanese Patent Application No. 2011-179162 (with translation).

(Continued)

*Primary Examiner* — Anthony Ho
(74) *Attorney, Agent, or Firm* — Oliff PLC (57) ABSTRACT

To provide a semiconductor device including a functional laminate having flatness and crystallinity improved by effectively passing on the crystallinity and flatness improved in a buffer to the functional laminate, and to provide a method of producing the semiconductor device; in the semiconductor device including the buffer and the functional laminate having a plurality of nitride semiconductor layers, the functional laminate includes a first n-type or i-type $Al_xGa_{1-x}N$ layer ($0 \leq x < 1$) on the buffer side, and an $Al_zGa_{1-z}N$ adjustment layer containing p-type impurity, which has an approximately equal Al composition to the first $Al_xGa_{1-x}N$ layer ($x-0.05 \leq z \leq x+0.05$, $0 \leq z < 1$) is provided between the buffer and the functional laminate.

12 Claims, 2 Drawing Sheets

(56) References Cited

OTHER PUBLICATIONS

Apr. 5, 2011 International Search Report issued in International Application No. PCT/JP2011/055172 (with translation).

Sep. 12, 2013 Office Action issued in U.S. Appl. No. 13/582,235.
Dec. 10, 2013 Office Action issued in Korean Patent Application No. 10-2012-7025096 (with English Translation).

* cited by examiner

SEMICONDUCTOR DEVICE AND METHOD OF PRODUCING THE SAME

TECHNICAL FIELD

The present invention relates to a semiconductor device and a method of producing the semiconductor device. The present invention particularly relates to a semiconductor device such as ultraviolet light emitting diodes, electronic devices, and to a method of producing the same.

RELATED ART

In recent years, ultraviolet LEDs (light emitting diodes) that can be favorably used in the fields of sterilization, water purification, medical treatment, illumination, high-density optical recording, and the like and high electron mobility transistors (HEMTs) which have a device structure formed using an AlGaN based thin film as a material are known. Further, for such ultraviolet LEDs and HEMTs having a device structure formed using an AlGaN-based thin film, various approaches have been made to obtain high quality AlGaN-based thin films.

In general, an ultraviolet LED has a functional laminate having a structure in which a light emitting layer is interposed between an n-type nitride semiconductor layer and a p-type nitride semiconductor layer. In order to relax strain due to difference in lattice constant between the nitride semiconductor layers and a substrate, a functional laminate is generally formed on the substrate with a buffer interposed therebetween. HEMTs have a functional laminate including an i-type channel layer and an n-type electron supply layer that are formed of nitride semiconductor layers. In order to reduce strain due to difference in lattice constant between the nitride semiconductor layers and the substrate, the functional laminate is also generally formed over the substrate with a buffer interposed therebetween.

Patent Document 1 discloses a nitride semiconductor substrate in which a first semiconductor layer (buffer) mainly containing AlN or AlGaN that is doped with a lateral growth promoting substance is formed on a substrate directly or with one or a plurality of nitride semiconductor layers mainly containing AlN or AlGaN interposed therebetween, and a functional laminate including a nitride semiconductor layer is formed thereon. According to this technique, lateral growth is promoted in the buffer, accompanied by promotion of coupling of dislocations, which allows the threading dislocation in a buffer surface to be reduced.

PRIOR ART DOCUMENT

Patent Document

Patent Document 1: Japanese Patent Application Publication No. JP2005-235908

DISCLOSURE OF THE INVENTION

Problems to be Solved by the Invention

In Patent Document 1, a typical AlN low-temperature deposited buffer layer is formed between a buffer and an n-type $Al_{0.4}Ga_{0.6}N$ layer. However, the relation of the Al compositions between the AlN low-temperature deposited buffer layer and the n-type $Al_{0.4}Ga_{0.6}N$ layer is not considered. Further, the AlN low-temperature deposited buffer layer reduces the effect of promoting lattice relaxation in the buffer provided thereunder; thus, crystallinity improvement due to lateral growth was not sufficient.

In addition, in a case where, on a buffer, a nitride semiconductor layer having a different composition from the buffer is formed as a functional laminate, problems of lattice mismatch between the nitride semiconductor layer of the functional laminate and the buffer has not been noted.

An object of the invention is to solve the above problems and provide a semiconductor device in which the crystal quality improved in a buffer is effectively passed on to a functional laminate to improve flatness and crystallinity of the functional laminate. Another object of the invention is to provide a method of producing the semiconductor device.

Means for Solving the Problem

The inventors of the present invention have made various studies to achieve the above objects to consequently find that the crystallinity and flatness improved in a buffer can be effectively passed on to a functional laminate by providing an $Al_zGa_{1-z}N$ adjustment layer between the buffer on a substrate and an n-type $Al_xGa_{1-x}N$ layer in a functional laminate having, for example, the n-type $Al_xGa_{1-x}N$ layer ($0 \leq x < 1$), a light emitting layer, and a p-type $Al_yGa_{1-y}N$ layer ($0 \leq y \leq 1$) from the buffer side. Note that the $Al_zGa_{1-z}N$ adjustment layer ($0 \leq z < 1$) is containing p-type impurity, and the Al composition z is within the range of ±0.05 from the Al composition x of the n-type $Al_xGa_{1-x}N$ layer in the functional laminate closest on the buffer side. Thus, they accomplished the present invention.

The present invention is based on the above findings, and its constituent features are as follows.

(1) A semiconductor device comprising a buffer and a functional laminate including a plurality of nitride semiconductor layers, on a substrate, wherein the functional laminate includes a first n-type or i-type $Al_xGa_{1-x}N$ layer ($0 \leq x < 1$) on the buffer side, and an $Al_zGa_{1-z}N$ adjustment layer containing p-type impurity, which has an approximately equal Al composition to the first $Al_xGa_{1-x}N$ layer ($x - 0.05 \leq z \leq x + 0.05$, $0 \leq z < 1$) is provided between the buffer and the functional laminate.

(2) The semiconductor device according to (1) above, wherein the substrate is an AlN template substrate.

(3) The semiconductor device according to (1) or (2), wherein the buffer includes an $Al_\alpha Ga_{1-\alpha}N$ layer ($0 \leq \alpha \leq 1$) at least on the functional laminate side, and difference between an Al composition α of the $Al_\alpha Ga_{1-\alpha}N$ layer and an Al composition x of the first $Al_xGa_{1-x}N$ layer is 0.1 or more.

(4) The semiconductor device according to any one of (1) to (3) above, wherein the first $Al_xGa_{1-x}N$ layer is n-type, and the functional laminate includes at least a light emitting layer and a second $Al_yGa_{1-y}N$ layer ($0 \leq y < 1$) in this order on the first $Al_xGa_{1-x}N$ layer.

(5) The semiconductor device according to any one of (1) to (4) above, wherein an i-type $l_wGa_{1-w}N$ layer ($x - 0.05 \leq w \leq x + 0.05$, $0 \leq w < 1$) not doped with impurity is further provided between the $Al_zGa_{1-z}N$ adjustment layer containing p-type impurity and the first $Al_xGa_{1-x}N$ layer.

(6) The semiconductor device according to (5) above, wherein the $Al_zGa_{1-z}N$ adjustment layer containing p-type impurity and the i-type $Al_wGa_{1-w}N$ layer not doped with impurity satisfy the relationship of z<w.

(7) The semiconductor device according to any one of (1) to (6) above, wherein a thickness of the $Al_zGa_{1-z}N$ adjustment layer containing p-type impurity is in a range of 100 nm to 1500 nm.

(8) The semiconductor device according to any one of (1) to (7) above, wherein the $Al_zGa_{1-z}N$ adjustment layer containing p-type impurity is doped with Mg, and the Mg concentration is in a range of $5\times10^{16}/cm^3$ to $2\times10^{20}/cm^3$.

(9) The semiconductor device according to any one of (1) to (8) above, wherein a concentration of O contained in the first $Al_xGa_{1-x}N$ layer is less than $2\times10^{18}/cm^3$.

(10) The semiconductor device according to any one of (1) to (9) above, wherein the buffer includes a superlattice strain buffer layer having a superlattice structure formed by alternately stacking $Al_\beta Ga_{1-\beta}N$ layers ($0\le\beta\le0.3$) and AlN layers.

(11) A method of producing a semiconductor device, wherein a buffer, an $Al_zGa_{1-z}N$ adjustment layer containing p-type impurity ($x-0.05\le z\le x+0.05$, $0\le z<1$), and a functional laminate including an i-type or n-type $Al_xGa_{1-x}N$ layer ($0\le x<1$) are sequentially formed on a substrate.

Effect of the Invention

The present invention can provide a semiconductor device having a functional laminate excellent in flatness and crystallinity and a method of producing the semiconductor device. The flatness and crystallinity improved in a buffer can be effectively passed on to the functional laminate by providing an $Al_zGa_{1-z}N$ adjustment layer between the buffer on a substrate and a first n-type or i-type $Al_xGa_{1-x}N$ layer in the functional laminate having an n-type $Al_xGa_{1-x}N$ layer ($0\le x<1$). The $Al_zGa_{1-z}N$ adjustment layer ($0\le z<1$) is containing p-type impurity, and the Al composition z is within the range of $\pm0.05$ from the Al composition x of the first $Al_xGa_{1-x}N$ layer.

BEST MODE FOR CARRYING OUT THE INVENTION

Embodiments of a semiconductor device in accordance with the present invention will be described with reference to the drawings.

Figure 1:
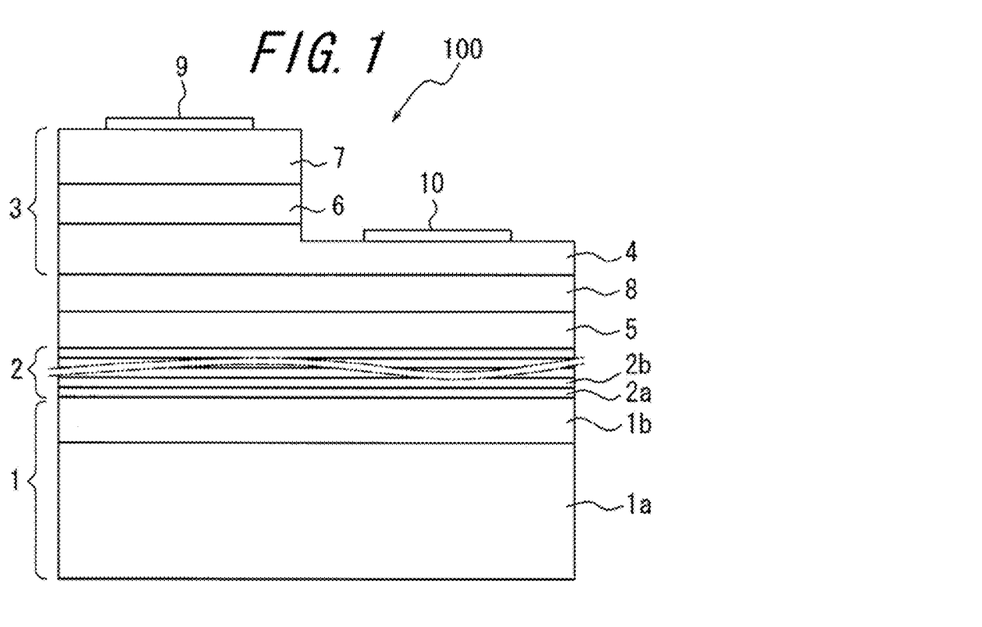
FIG. 1 is a schematic cross-sectional view of a semiconductor device 100 in accordance with the present invention.

FIG. 1 is a schematic cross-sectional view showing an example of the semiconductor device 100 in accordance with the present invention.

The semiconductor device 100 in accordance with the present invention includes a buffer 2 and a functional laminate 3 having a plurality of nitride semiconductor layers on a substrate 1 as shown in FIG. 1. The semiconductor device 100 is characterized in that the functional laminate 3 has a first n-type or i-type $Al_xGa_{1-x}N$ layer ($0\le x<1$) 4 (n-type in FIG. 1) on the buffer 2 side, and an $Al_zGa_{1-z}N$ adjustment layer ($x-0.05\le z\le x+0.05$, $0\le z<1$) 5 (hereinafter also referred to simply as "adjustment layer 5") is provided between the buffer 2 and the functional laminate 3. The adjustment layer 5 contains p-type impurity, and has an approximately equal Al composition to the first $Al_xGa_{1-x}N$ layer 4. With such a structure, flatness and crystallinity improved in the buffer 2 can be effectively passed on to the functional laminate 3, which results in preferable flatness and crystallinity of the functional laminate 3. Note that the functional laminate 3 refers to a portion serving as a device, in which for example electric current flows, in a semiconductor device such as an LED or an HEMT, and the function of a device is not imparted to the adjustment layer 5 even if the adjustment layer 5 is adjacent to the first $Al_xGa_{1-x}N$ layer ($0\le x<1$) 4.

The $Al_zGa_{1-z}N$ adjustment layer 5 containing p-type impurity is provided between the buffer 2 and the n-type $Al_xGa_{1-x}N$ layer 4, which can particularly prevent impurities such as oxygen (O) from diffusing into the functional laminate 3 from the substrate 1; as a result, the light output can be improved. Further, since the adjustment layer 5 contains p-type impurity, lateral growth in the adjustment layer 5 is promoted, and the flatness of the adjustment layer 5 can be improved, which consequently improves the flatness of layers thereon. Further, the Al composition z of the $Al_zGa_{1-z}N$ adjustment layer 5 containing p-type impurity is set within the range of $\pm0.05$ from the Al composition x of the n-type $Al_xGa_{1-x}N$ layer 4, so that the crystallinity and flatness improved in the buffer 2 and the p-type $Al_zGa_{1-z}N$ adjustment layer 5 can be effectively passed on to the n-type $Al_xGa_{1-x}N$ layer 4 and even to the layers provided thereon. Thus, the semiconductor device 100 of the present invention can achieve high light output.

Here, the p-type impurity is preferably Mg, Zn, Ca, or Be, more preferably Mg or Zn, and Mg is highly preferred. In terms of the segregation effect for nitride semiconductors, Mg, Zn, Ca, or Be can be used as the p-type impurity. Mg or Zn is preferred as a lateral crystal growth promoting substance for promoting the crystal growth of AlGaN or GaN in the lateral direction. Among them, Mg hardly diffuses into other layers, which makes it highly preferable as a lateral crystal growth promoting substance. Further, the $Al_zGa_{1-z}N$ adjustment layer containing p-type impurity may be not only a p-type $Al_zGa_{1-z}N$ adjustment layer obtained by activation of p-type impurity but alternatively an $Al_zGa_{1-z}N$ adjustment layer doped with p-type impurity not subjected to an activation process.

It is preferable that the first $Al_xGa_{1-x}N$ layer 4 is n-type, and the functional laminate 3 has at least a light emitting layer 6 and a second p-type $Al_yGa_{1-y}N$ layer ($0\le y<1$) 7 in this order on the first $Al_xGa_{1-x}N$ layer 4. With the thus formed light emitting device, the flatness and crystallinity improved in the buffer 2 can be effectively passed on to the functional laminate 3, in particular to the light emitting layer 6 in the functional laminate 3; thus, the functional laminate 3 can have preferable flatness and crystallinity, and light output can be improved.

Further, an i-type $Al_wGa_{1-w}N$ layer ($0\le w<1$) 8 not doped with impurity (hereinafter also referred to as "undoped" $Al_wGa_{1-w}N$ layer 8) having an approximately equal Al composition to the first $Al_xGa_{1-x}N$ layer 4 is preferably provided in addition between the adjustment layer 5 and the first $Al_xGa_{1-x}N$ layer 4. Moreover, the Al composition w of this undoped $Al_wGa_{1-w}N$ layer 8 is preferably within the range of $\pm0.05$ from the Al composition x of the first $Al_xGa_{1-x}N$ layer 4. This is for effectively passing on the crystallinity and flatness improved in the adjustment layer 5 to the first $Al_xGa_{1-x}N$ layer 4 and even to layers thereon; further preventing the diffusion of the above impurities; and avoiding thyristor effects due to pn junction in a case where the first $Al_xGa_{1-x}N$ layer 4 is n-type.

More preferably, $x-0.05\le z<w\le x+0.05$ may be taken. Strain due to lattice constant difference between a layer in the buffer 2 on the closest side to the functional laminate 3 and the first $Al_xGa_{1-x}N$ layer 4 (lattice constant difference between x and $\alpha$ to be described) can be more appropriately reduced due to the relationship between the $Al_zGa_{1-z}N$ adjustment layer 5 containing p-type impurity and the i-type $Al_wGa_{1-w}N$ layer 8. With the relation $x-0.05\le z<w\le x+0.05$, upper layers have higher Al composition and consequently have a relatively small lattice constant, so that tensile stress is applied by lower layers to the layers stacked thereabove. In other words, tensile stress is applied in the crystal growth of the i-type $Al_wGa_{1-w}N$ layer 8. Therefore, crystal growth of the i-type $Al_wGa_{1-w}N$ layer 8 not doped with p-type impurity itself can additionally have an effect of promoting lateral growth, and the effect of maintaining the improved flatness can be further enhanced by the i-type $Al_wGa_{1-w}N$ layer 8. However, when the composition difference from x is more than 0.05, cracks would occur or flatness would be affected by strain due to the difference in the lattice constant.

The i-type $Al_xGaN$ layer not doped with impurity here refers to a layer which is not designed to be doped with specific impurity (also referred to as "undoped layer"). Ideally, a semiconductor preferably contains no impurity; however, a semiconductor with low carrier density (for example, less than $5\times10^{16}/cm^3$) can be referred to as i-type as long as it does not electrically serve as a p-type or n-type semiconductor.

The thickness of the adjustment layer 5 is preferably in the range of 100 nm to 1500 nm, more preferably 100 nm to 300 nm. When the thickness is less than 100 nm, sufficient surface flatness would not be achieved; when the thickness is more than 1500 nm, cracks would occur in the surface of the adjustment layer; and when the thickness is more than 300 nm, cracks would occur in the functional laminate.

The adjustment layer 5 is doped with magnesium (Mg), and its Mg concentration is preferably in the range of $5\times10^{16}/cm^3$ to $2\times10^{20}/cm^3$. When Mg is used as p-type impurity, the lateral growth of the adjustment layer 5 is promoted to help promotion of planarization. When the Mg concentration is less than $5\times10^{16}/cm^3$, sufficient surface flatness would not be achieved. Further, when the Mg concentration is more than $2\times10^{20}/cm^3$, the Mg concentration is supersaturated to cause segregation, which would significantly impair the flatness of the surface.

The concentration of oxygen (O) contained in the first $Al_xGa_{1-x}N$ layer 4 is preferably less than $2\times10^{18}/cm^3$, more preferably $1\times10^{18}/cm^3$ or less. Oxygen contained in the n-type $Al_xGa_{1-x}N$ layer 4 has been mixed in, for example when a layer is stacked on the substrate 1 with oxygen in the atmosphere being attached thereto and the oxygen is diffused into the upper layer. The oxygen causes reduction in the power output of light emitting devices; therefore, the concentration is preferably even lower.

The buffer 2 serves to reduce dislocation or strain resulted from the lattice mismatch or thermal expansion difference between the substrate 1 and the functional laminate 3, and it can be selected from known buffers depending on the type of the substrate 1 and the functional laminate 3. The present invention is advantageous in a case where the Al compositions of layers in the buffer 2 and the functional laminate 3 that are most close to each other are different, and particularly in a case where the difference of the Al compositions is 0.1 or more. Specifically, the difference between the Al composition a of the $Al_\alpha Ga_{1-\alpha}N$ layer ($0\leq\alpha\leq1$) in the buffer 2 on the closest side to the functional laminate 3 and the Al composition x of the first $Al_xGa_{1-x}N$ layer 4 is preferably 0.1 or more.

The buffer 2 may be a single layer or a multilayer, but a superlattice is preferably used. Further, the buffer 2 more preferably includes a superlattice strain buffer layer having a superlattice structure formed by alternately stacking $Al_\beta Ga_{1-\beta}N$ layers ($0\leq\beta\leq0.3$) 2a and AlN layers 2b. The $Al_\beta Ga_{1-\beta}N$ layers ($0\leq\beta\leq0.3$) 2a are preferred to be p-type. This is for reducing lattice mismatch and improving the flatness. Note that the layered structure of the superlattice strain buffer layer is partially omitted in the figure. Although not shown in the figure, an AlN layer having a thickness ranging from 500 nm to 1500 nm epitaxially grown on the substrate 1 using a known technique such as MOCVD, MOVPE, HVPE, or MBE, for example, may be provided as an initial layer between the substrate 1 and the superlattice strain buffer layer.

For the thickness of the layers forming the superlattice strain buffer layer, the thickness of the p-type $Al_\beta Ga_{1-\beta}N$ layers 2a may be for example, 0.1 nm to 3 nm, preferably 2 nm or less, while the thickness of the AlN layers 2b may be for example, 0.1 nm to 9 nm, preferably 0.9 nm to 9 nm. Further, as to the number of the stacked p-type $Al_\beta Ga_{1-\beta}N$ layers 2a and AlN layers 2b, the number of the pairs of the p-type $Al_\beta Ga_{1-\beta}N$ layers 2a and AlN layers 2b can be, for example 20 to 70, preferably 20 to 50. Such a number of stacked layers can sufficiently suppress the occurrence of dislocation. Assuming that the superlattice strain buffer layer is AlGaN, the Al composition is generally calculated from the Al composition and the thickness of each layer. It should be noted that the Al composition of the surfaces of the buffer 2 facing to the functional laminate 3 does not refer to the calculated Al composition of the superlattice, but to the practical Al composition of the surfaces irrespective of the thickness.

Note that in the superlattice strain buffer layer, the AlN layers 2b made of AlN are thicker (the ratio of the AlN layers 2b is higher) on the substrate 1 side, and the ratio of the AlN layers 2b with respect to the p-type $Al_\beta Ga_{1\beta}N$ layers 2a preferably decreases gradually to the side of the n-type $Al_xGa_{1-x}N$ layer 4. With such a structure, the crystallinity of the n-type $Al_xGa_{1-x}N$ layer 4 can be further improved.

Further, the superlattice strain buffer layer is not substantially electrically conductive as a whole (for example, the specific resistance measured by a sheet resistance measuring apparatus is 10 $\Omega\cdot$cm/square or more), and the impurity concentration of the whole superlattice strain buffer layer measured by SIMS is preferably $1\times10^{18}$ cm$^{-3}$ or less, more preferably $7\times10^{17}$ cm$^{-3}$ or less. When the impurity concentration is more than $1\times10^{18}$ cm$^{-3}$, thyristor failure would occur in the nitride semiconductor device.

In general, doping of AlN layers with p-type impurity is difficult and involves deterioration of crystallinity; therefore, the AlN layers are designed not to be doped with p-type impurity. In contrast, since the superlattice strain buffer layer of the present invention is not required to be electrically conductive, the amount of impurities in the AlN layers 2b is preferably much smaller than the normal impurity doping amount, excluding unavoidable impurity diffused from the p-type $Al_\beta Ga_{1-\beta}N$ layers 2a.

Here, layers having a low Al content: an Al composition β ranging $0\leq\beta\leq0.3$, which further contain p-type impurity, can be used as the p-type $Al_\beta Ga_{1-\beta}N$ layers 2a. Note that, as the p-type impurity, for example Mg, Zn, Ca, or Be can be used. The p-type impurity can be contained in the $Al_\beta Ga_{1-\beta}N$ layers 2a by supplying the p-type impurity simultaneously with a source gas in the formation of the $Al_\beta Ga_{1-\beta}N$ layers 2a and alternatively by intermittently supplying the p-type impurity onto the AlN layers 2b, then forming the $Al_\beta Ga_{1-\beta}N$ layers 2a, and diffusing the p-type impurity into the $Al_\beta Ga_{1-\beta}N$ layers 2a. The concentration of the p-type impurity in the p-type $Al_\beta Ga_{1-\beta}N$ layers 2a may be, for example, $5\times10^{16}/cm^3$ or more and less than $2\times10^{20}/cm^3$, preferably $7\times10^{17}/cm^3$ to $1.7\times10^{19}/cm^3$, more preferably $7\times10^{18}/cm^3$ to $1.7\times10^{19}/cm^3$.

In addition, a known substrate that is different kind from Group III nitride on which a Group III nitride can be grown can be used as the substrate 1. An AlN template substrate in which a single crystal AlN layer 1b is grown directly on a sapphire base substrate 1a, and an AlGaN template substrate in which a single crystal AlGaN layer b is directly grown on a sapphire base substrate 1a are preferable. A Si substrate is also preferred.

The inventors found that when an AlN template substrate is used, the above attachment of oxygen (O) in the atmosphere more easily occurs as compared with the case of using a sapphire substrate, and rise in the concentration of oxygen in the functional laminate 3 due to the attached oxygen is required to be suppressed. Then, with respect to a semiconductor device of the present invention, they found that the diffusion of the oxygen (O) into the functional laminate 3 can be effectively suppressed by providing the $Al_zGa_{1-z}N$ adjustment layer 5 containing p-type impurity. The layer containing p-type impurity, which has an adequate thickness is considered to suppress the diffusion of oxygen (O).

Si or the like is preferably used as n-type impurity in the n-type $Al_xGa_{1-x}N$ layer 4. A layer made of $Al_\gamma In_\delta Ga_{1-\gamma-\delta}N$ (where $0 \leq \gamma \leq 1$, $0 \leq \delta \leq 1$, $0 \leq \gamma+\delta \leq 1$) can be used as the light emitting layer 6. Mg, Zn, Ca, Be, or the like is preferably used as p-type impurity in the p-type $Al_yGa_{1-y}N$ layer 7. The thickness of the layers may be, for example, as follows: the n-type $Al_xGa_{1-x}N$ layer 4: 1300 nm to 1400 nm, the light emitting layer 6: 50 nm to 80 nm, and the p-type $Al_yGa_{1-y}N$ layer 7: 200 nm to 300 nm. Note that these layers can be formed by epitaxial growth using known techniques.

Further, as shown in FIG. 1, a p-side electrode 9 can be provided on the p-type $Al_yGa_{1-y}N$ layer 7, and an n-side electrode 10 can be provided on the partially exposed n-type $Al_xGa_{1-x}N$ layer 4. A NiAu electrode obtained by sequentially vapor-depositing a Ni-containing film and an Au-containing film by vacuum vapor deposition, for example, may be used as the p-side electrode 9. A TiAl electrode obtained by sequentially vapor-depositing a Ti-containing film and an Al-containing film by vacuum vapor deposition, for example, may be used as the n-side electrode 10.

Next, an embodiment of a method of producing a semiconductor device according to the present invention will be described with reference to the drawings.

Figure 2:
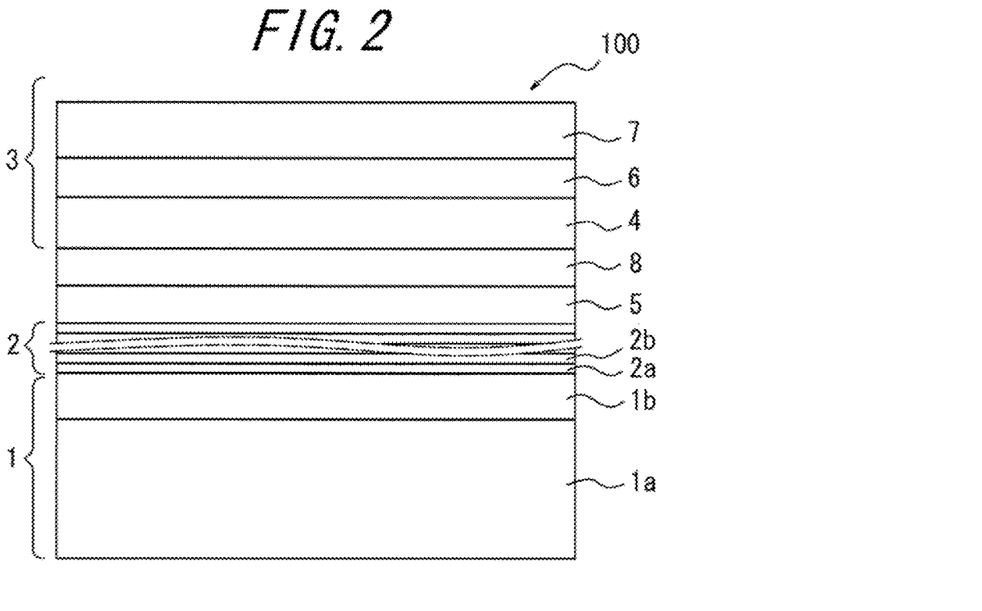
FIG. 2 is a schematic cross-sectional view showing a layered structure in a production of a semiconductor device 100 according to the present invention.

FIG. 2 schematically shows an example of a layered structure of a semiconductor device 100 in accordance with the present invention at a stage of production.

The method of producing the semiconductor device 100 in accordance with the present invention is characterized by sequentially forming a buffer 2, an $Al_zGa_{1-z}N$ adjustment layer ($x-0.05 \leq z \leq x+0.05$, $0 \leq z < 1$) 5 containing p-type impurity, and a functional laminate 3 containing an i-type or n-type $Al_xGa_{1-x}N$ layer ($0 \leq x < 1$) 4, on a substrate 1 for example by MOCVD, as shown in FIG. 2. With such a structure, flatness and crystallinity improved in the buffer can be effectively passed on to the functional laminate, so that a semiconductor device having the functional laminate with favorable flatness and crystallinity can be provided.

Next, when the semiconductor device is a light emitting device, as shown in FIG. 1, at least a p-type $Al_yGa_{1-y}N$ layer 7 and a light emitting layer 6 (and part of an n-type $Al_xGa_{1-x}N$ layer 4) which have been formed on the adjustment layer 5 are etched by dry etching to partially expose the n-type $Al_xGa_{1-x}N$ layer 4 on the light emitting layer 6 side (in the upper part of FIG. 1). Then, finally, a p-side electrode 9 and an n-side electrode 10 are formed by vacuum vapor deposition to electrically connect the n-type $Al_xGa_{1-x}N$ layer 4 and the p-type $Al_yGa_{1-y}N$ layer 7. Thus, a semiconductor device 100 shown in FIG. 1 can be obtained.

Since p-type impurity is contained in the adjustment layer 5 of the thus produced semiconductor device 100, lateral crystal growth of the adjustment layer 5 is promoted, so that the flatness and crystallinity of the adjustment layer 5 is improved. Accordingly, the flatness and crystallinity of the n-type $Al_xGa_{1-x}N$ layer 4 formed on the adjustment layer 5 is also improved, which consequently improves the flatness and crystallinity of the light emitting layer 6 and the p-type $Al_yGa_{1-y}N$ layer 7 thereon. Thus, a semiconductor device 100 with high light output can be obtained.

The n-type $Al_xGa_1N$ layer 4 of a nitride semiconductor device of the present invention may be a laminate of an n-cladding layer and an n-contact layer. Meanwhile, the p-type $Al_yGa_{1-y}N$ layer 7 may be a laminate of a p-cladding layer and a p-contact layer.

The case where the first $Al_xGa_{1-x}N$ layer is n-type has been described above; however, the present invention can also be applied to cases where the first $Al_xGa_{1-x}N$ layer is undoped i-type. When the first $Al_xGa_{1-x}N$ layer is i-type, for example, this i-type $Al_xGa_{1-x}N$ layer is used as a channel layer, and an n-type AlGaN-based layer provided thereon as an electron supply layer, and three electrodes of a source, a gate, and a drain are provided thereon to obtain an electronic device having a HEMT structure.

The above description merely shows examples of embodiments of the present invention, and the present invention is not limited to the embodiments. For example, the above AlGaN layer may be a layer into which In, B, or the like is inevitably mixed at approximately 1% or less.

EXAMPLES

Here, to show the advantage of the adjustment layer 5 in the present invention containing p-type impurity, the fact that significantly favorable flatness can be achieved in a case of forming p-type AlGaN on AlN as compared with a case of forming an n-type or i-type AlGaN layer will be shown experimentally.

Experimental Example 1

A Mg-doped p-type $Al_{0.31}Ga_{0.69}N$ layer (thickness: 1000 nm, doped with Mg, Mg concentration: $1 \times 10^{19}/cm^3$) was grown on an AlN template substrate by MOCVD.

Experimental Example 2

A Si-doped n-type $Al_{0.31}Ga_{0.69}N$ layer (thickness: 1000 nm, doped with Si, Si concentration: $4 \times 10^{18}/cm^3$) was grown on an AlN template substrate by MOCVD.

Experimental Example 3

An undoped i-type $Al_{0.31}Ga_{0.69}N$ layer (thickness: 1000 nm) was grown on an AlN template substrate by MOCVD.

(Evaluation 1)

Surfaces of the Mg-doped AlGaN layer in Experimental Example 1 above, the n-type AlGaN layer in Experimental Example 2 above, and the i-type AlGaN layer in Experimental Example 3 above were observed using an optical microscope and an atomic force microscope (AFM) to evaluate the flatness of the surfaces using the arithmetic mean roughness Ra obtained by the AFM measurement.

Figure 3A:
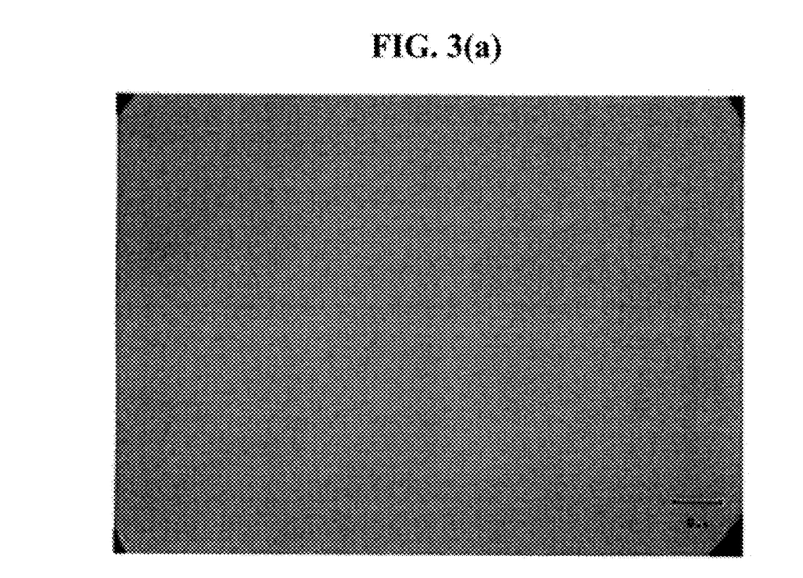
FIGS. 3(a) and 3(b) are 1000× photomicrographs of surfaces in Experimental Examples 1 and 2, respectively.
Figure 3B:
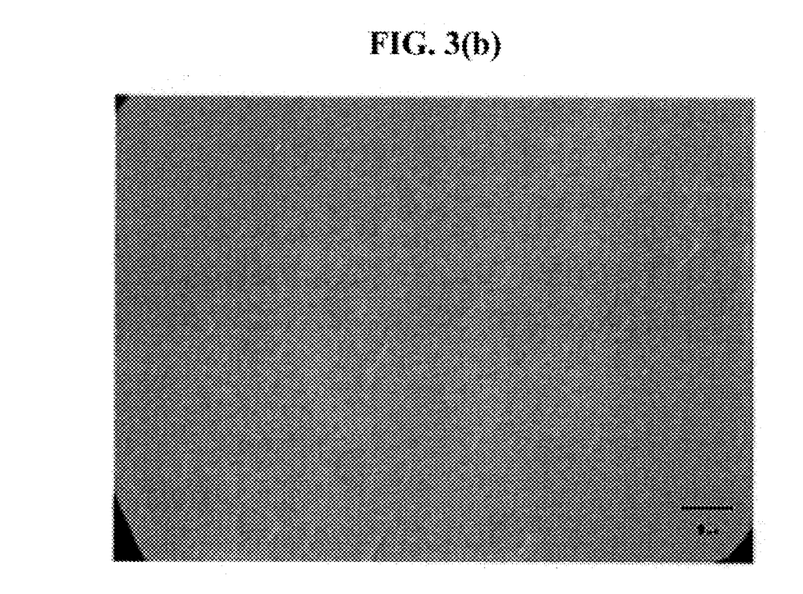

FIGS. 3(a) and 3(b) are micrographs, taken through an optical microscope (1000×), of the surfaces in Experimental Examples 1 and 2, respectively. As evident from the micrographs, no step was seen in Experimental Example 1, while steps were observed in the same field of view in Experimental Example 2. This reveals that Experimental Example 1 in which the Mg-doped $Al_{0.31}Ga_{0.69}N$ layer was grown on the substrate achieved a flatter surface than Experimental Example 2 in which the n-type $Al_{0.31}Ga_{0.69}N$ layer was grown on the substrate. Steps were also found in the surface of Experimental Example 3 similarly to Experimental Example 2.

Further, from the results of the AFM measurements, the arithmetic mean roughness Ra was as follows: Experimental Example 1: Ra=0.74 nm, Experimental Example 2: Ra=6.32 nm, and Experimental Example 3: Ra=5.94 nm. This shows that Experimental Example 1 achieved a significantly flatter surface as compared with Experimental Examples 2 and 3.

The above shows that when the n-type AlGaN layer having a very different Al composition from AlN was formed on AlN, irregularities were formed on the surface of the n-type AlGaN layer. Meanwhile, when the Mg-doped AlGaN layer having a very different Al composition from AlN was formed on AlN, the surface of the Mg-doped AlGaN layer was flat. Note that the flatness of the surface of the undoped i-type AlGaN layer was also impaired to an extent similar to the n-type AlGaN layer in the case where the i-type AlGaN layer was grown directly on AlN.

Example 1

An AlN layer (thickness: 27 nm) was stacked as an initial layer by MOCVD on an AlN template substrate, and then a buffer (superlattice strain buffer layer), a p-type $Al_{0.31}Ga_{0.69}N$ adjustment layer (thickness: 100 nm, Mg concentration: $1 \times 10^{18}/cm^3$) doped with Mg as a substance for promoting planarization, an undoped i-type $Al_{0.35}Ga_{0.65}N$ layer (thickness: 300 nm) were epitaxially grown thereon in this order. Further, an n-type $Al_{0.35}Ga_{0.65}N$ layer (thickness: 1300 nm, doped with Si, Si concentration: $1 \times 10^{19}/cm^3$), a light emitting layer (multiple quantum well structure with an emission wavelength of 325 nm, total thickness: 64.5 nm), and a p-type $Al_{0.32}Ga_{0.68}N$ layer (thickness: 280 nm, doped with Mg, Mg concentration: $1.5 \times 10^{19}/cm^3$) were epitaxially grown in this order to form a functional laminate. Thus, an epitaxial laminate was formed on the substrate. Specifically, in this example, z=0.31, w=x=0.35, and y=0.32 were satisfied and z was within the range of ±0.05 from x; w was equal to x; and z<w.

Note that the superlattice strain buffer layer had a structure in which a superlattice laminate I having 20 pairs of alternately stacked AlN layers (thickness: 9 nm) and GaN layers (thickness: 2.1 nm), a superlattice laminate II having 30 pairs of alternately stacked AlN layers (thickness: 2.7 nm) and GaN layers (thickness: 2.1 nm), and a superlattice laminate III having 50.5 pairs of alternately stacked AlN layers (thickness: 0.9 nm) and GaN layers (thickness: 2.1 nm) ("50.5 pairs" implies that both the first layer and the last layer in the laminate were AlN layers) were sequentially stacked. The GaN layers were doped with Mg.

Here, the layer in the buffer (superlattice strain buffer layer) on the closest side of the functional laminate was an AlN layer. The difference (α-x) between the Al composition α of the buffer on the functional laminate side (the AlN layer) and the Al composition x of the functional laminate on the buffer side (n-type $Al_{0.35}Ga_{0.65}N$ layer), the AlN layer and the n-type $Al_{0.35}Ga_{0.65}N$ layer being opposite to each other, was 1.0−0.35=0.65, and was more than 0.1. Assuming that the superlattice laminate III was AlGaN, the total Al composition η is calculated as 0.9 nm/2.1 nm=0.43. The production conditions of the superlattice strain buffer layer and the p-type $Al_{0.31}Ga_{0.69}N$ layer are shown in Table 1.

TABLE 1

| Device structure | | Al Composition | TMG (sccm) | TMA (sccm) | $NH_3$ (slm) | $Cp_2Mg$ (sccm) |
|---|---|---|---|---|---|---|
| Mg-doped $Al_{0.31}Ga_{0.69}N$ layer | | 0.31 | 15 | 30 | 10 | 25 |
| Super- lattice strain buffer layer | Superlattice laminate III | 0 | 20 | — | 10 | 25 |
| | | 1 | — | 10 | 0.5 | — |
| | Superlattice laminate II | 0 | 20 | — | 10 | 25 |
| | | 1 | — | 10 | 0.5 | — |
| | Superlattice laminate I | 0 | 20 | — | 10 | 25 |
| | | 1 | — | 10 | 0.5 | — |

Comparative Example 1

An epitaxial laminate was formed in a manner similar to Example 1 except for that the p-type $Al_{0.31}Ga_{0.69}N$ adjustment layer doped with Mg was not formed.

Example 2

An epitaxial laminate was formed in a manner similar to Example 1 except for that the Al composition of the undoped i-type AlGaN layer was w=0.29 and the Al composition of the n-type AlGaN layer in the functional laminate was x=0.29. Since z=0.31, z is within the range of ±0.05 from x in this example, but z>w.

Example 3

An epitaxial laminate was formed in a manner similar to Example 1 except for that the undoped i-type $Al_{0.35}Ga_{0.65}N$ layer was not formed. In this example, z=0.31 and x=0.35.

Comparative Example 2

An epitaxial laminate was formed in a manner similar to Example 3 except for that the Al composition of the p-type AlGaN adjustment layer was z=0.19. In this comparative example, x=0.35 without change, so that z is out of the range of ±0.05 from x.

Comparative Example 3

An epitaxial laminate was formed in a manner similar to Example 3 except for that the Al composition of the p-type AlGaN adjustment layer was z=0.41. In this comparative example, x=0.35 without change, so that z is out of the range of ±0.05 from x.

(Evaluation 2)

Samples of Examples 1-3 and Comparative Examples 1-3 above at a stage where the functional laminate had been formed were analyzed by an X-ray diffractometer to find half widths of the peaks corresponding to the (0002) plane and the (10-12) plane. The results are shown in Table 2. Note that the smaller the half width is, the better the crystallinity is. With respect to the sample of Comparative Example 2, the half width could not have been measured since the surface of the functional laminate was cracked.

TABLE 2

|  | Half width (arcsec) | |
| --- | --- | --- |
|  | (0002) | (10-12) |
| Comparative Example 1 | 368 | 683 |
| Example 1 | 334 | 528 |
| Example 2 | 343 | 542 |
| Example 3 | 355 | 619 |
| Comparative Example 2 |  | Cracked |
| Comparative Example 3 | 366 | 663 |

(Evaluation 3)

With respect to the samples of Examples 1-3 and Comparative Examples 1-3 above, the growth surface was scribed with a diamond pen; Indium dots were physically pressed on a point where the n-type AlGaN layer was exposed and a point 1.5 mm apart from this exposed point. Thus, a simple nitride semiconductor device using the formed two points as an n-type electrode and a p-type electrode was manufactured. Then, probes were put on those points; light was output from the rear surface after a DC current of 20 mA was applied; and the light was guided to a multi-channel spectrometer through an optical fiber. The peak intensity of the spectrum was converted to output power to obtain the light output power Po. The emission wavelength was 327 nm in each of the cases. The results are shown in Table 3. Note that the sample of Comparative Example 2 did not emit light.

TABLE 3

|  | Light output (mW) |
| --- | --- |
| Comparative Example 1 | 0.2 |
| Example 1 | 2.1 |
| Example 2 | 1.7 |
| Example 3 | 1.1 |
| Comparative Example 2 | No light output |
| Comparative Example 3 | 0.3 |

(Evaluation 4)

With respect to the samples of Examples 1-3 and Comparative Examples 1-3, the reflectance of the surface after the growth of the AlGaN adjustment layer doped with Mg, during the growth of the i-type AlGaN layer growth, during the growth of the n-type AlGaN layer forming the functional laminate, and during the growth of the light emitting layer was measured, which were normalized with the reflectance of the surface after the growth of the superlattice strain buffer layer.

In order to measure the reflectance of a surface of a wafer being grown, a xenon lamp light source and optical system members which enable irradiation of the wafer through a furnace window were prepared. The wafer was irradiated with the source light, and the reflected light guided through the optical fiber from a light receiving portion was measured by a spectrophotometer. The optical axis was adjusted by using a previously polished sapphire substrate, and the reflection intensity was measured. Relative reflection intensity was determined from the reflectance of the sapphire substrate and the reflectance of the samples at each growth stage. When the sample is grown with its surface being flat, in other words, with the flatness of the surface being high, light passes along the optical axis from the light source to the light receiving portion; therefore, the light intensity of the received light is shown as a constant value. However, when the sample is grown with its surface being rough, light is scattered on the wafer; therefore, the intensity of light to be received becomes lower as compared with the case of flat surface. With this measurement system, the in-situ surface condition of the wafer just being grown can be measured in the form of the light intensity over time, and the change in the surface condition of the wafer during growth can be followed. In this measurement, based on the relative intensity with respect to sapphire which was determined in the growth of the superlattice strain buffer layer, the relative intensity of each growth layer with respect to sapphire was normalized with the relative intensity of the superlattice strain buffer layer. The results are shown in Table 4. The measurement could not be performed on the sample of Comparative Example 2 because of cracks.

TABLE 4

|  | Comparative Example 1 | Example 1 | Example 2 | Example 3 | Comparative Example 2 | Comparative Example 3 |
| --- | --- | --- | --- | --- | --- | --- |
| Light emitting layer | 0.58 | 1.20 | 1.01 | 0.79 | Unmeasurable | 0.59 |
| N-type AlGaN layer | 0.66 | 0.93 | 0.86 | 0.76 |  | 0.67 |
| I-type AlGaN layer | 0.66 | 0.93 | 0.86 |  |  |  |
| P-type AlGaN layer |  | 0.95 | 0.95 | 0.95 |  | 0.95 |
| Superlattice strain buffer layer | 1.00 | 1.00 | 1.00 | 1.00 |  | 1.00 |

As seen in Table 4, in Comparative Examples 1 and 3, the reflectance was not maintained after the growth of the superlattice strain buffer layer, and the reflectance was reduced as upper layers were stacked. Meanwhile, in Examples 1-3, the reflectance was maintained even after the growth of the superlattice strain buffer layer than Comparative Examples 1 and 3. This is considered because the flatness and crystallinity improved in the buffer were effectively passed on to the functional laminate through the p-type $Al_{0.31}Ga_{0.69}N$ adjustment layer.

Note that the intensity of the light emitting layer in Example 1 was 1.2 because the Al composition of the light emitting layer was low and the refractive index thereof was high, which accordingly increased the difference between the refractive indices of the light emitting layer and the ambient gas in the furnace (refractive index of a mixture of $N_2$ and $H_2$, which was almost equal to the refractive index of the atmosphere) to increase the reflectance. On the other hand, in Comparative Examples 1 and 3, the reflectance of the light emitting layer was lower than that of the n-type AlGaN layer, which was resulted from the reduction in the reflectance evidently due to surface roughness.

(Evaluation 5)

The impurity concentration of the samples of Example 1 and Comparative Example 1 above was measured by SIMS.

The oxygen (O) concentration of the n-type $Al_{0.35}Ga_{0.65}N$ layer and the light emitting layer in Example 1 was $1 \times 10^{18}/cm^3$, while the oxygen (O) concentration of those in Comparative Example 1 was $8 \times 10^{18}/cm^3$. The oxygen (O) concentration of the n-type AlGaN layer and the light emitting layer in Examples 2 and 3 was also approximately equal to that in Example 1 and was less than $2\times10^{18}/cm^3$. Therefore, the p-type AlGaN adjustment layer of the present invention reduced the concentration of oxygen (O) in the layers to be stacked afterwards to less than $2\times10^{18}/cm^3$, which contributed to the improvement in the light output.

The above results show that with respect to a semiconductor device in accordance with the present invention, the flatness and crystallinity improved in the buffer were passed on to the $Al_{0.31}Ga_{0.69}N$ adjustment layer containing p-type impurity to approximate the Al composition of the adjustment layer to the Al composition of the AlGaN layer thereon. Accordingly, the flatness and crystallinity were passed on to the i-type or n-type $Al_{0.35}Ga_{0.65}N$, and further to the whole functional laminate. Thus, the light output of the device was demonstrated to be improved. Still further, comparing Example 1 and Example 3, it was found that an i-type $Al_wGa_{1-w}N$ layer not being doped with impurity is preferably provided in addition; meanwhile, comparing Example 1 and Example 2, z<w is more preferable.

It is evident that a high output light emitting device can be obtained by fabricating a semiconductor device by then partially exposing the n-type AlGaN layer forming the functional laminate obtained in this example by dry etching, for example, forming an n-side electrode on the n-type AlGaN layer, and forming a p-side electrode on the p-type AlGaN layer.

In cases where an AlGaN layer is grown directly on AlN as in Experimental Example 2 and Experimental Example 3, the surface flatness is affected. It was found that the surface of the AlGaN layer can be planarized by providing an AlGaN adjustment layer containing p-type impurity of the present invention therebetween with an appropriate Al composition, and that this further contributes to the improvement in crystallinity.

Use of an adjustment layer of the present invention makes it possible to improve flatness and crystallinity of a nitride semiconductor layer provided thereon, and this can be applied to electronic devices such as HEMTs and the like without limitation to light emitting devices. Specifically, for example when a superlattice buffer and a non-doped channel layer has an AlGaN layer containing p-type impurity, which has an approximately equal Al composition to the channel layer therebetween, the flatness and crystallinity improved in the buffer can be effectively passed on, and the flatness and crystallinity of the channel layer and layers provided thereon can be improved.

INDUSTRIAL APPLICABILITY

The present invention can provide a semiconductor device having a functional laminate excellent in flatness and crystallinity and a method of producing the semiconductor device. The flatness and crystallinity improved in a buffer can be effectively passed on to the functional laminate by providing an $Al_xGa_{1-z}N$ adjustment layer between the buffer on a substrate and a first n-type or i-type $Al_xGa_{1-x}N$ layer in the functional laminate having an n-type $Al_xGa_{1-x}N$ layer ($0 \le x < 1$). The $Al_zGa_{1-z}N$ adjustment layer ($0 \le z < 1$) is containing p-type impurity, and the Al composition z is within the range of $\pm 0.05$ from the Al composition x of the first $Al_xGa_{1-x}N$ layer.

EXPLANATION OF REFERENCE NUMERALS

100: Semiconductor device
1: Substrate
1a: Sapphire substrate
1b: AlN or AlGaN layer
2: Buffer layer
2a: P-type $Al_\beta Ga_{1-\beta}N$ layer
2b: AlN layer
3: Functional laminate
4: N-type $Al_xGa_{1-x}N$ layer
5: P-type impurity containing $Al_zGa_{1-z}N$ adjustment layer
6: Light emitting layer
7: P-type $Al_yGa_{1-y}N$ layer
8: I-type $Al_wGa_{1-w}N$ layer not doped with impurity
9: P-side electrode
10: N-side electrode

The invention claimed is:

1. A semiconductor device comprising a buffer and a functional laminate including a plurality of nitride semiconductor layers, on a substrate,
wherein the functional laminate includes a first n-type or i-type $Al_xGa_{1-x}N$ layer ($0 \le x < 1$) on the buffer side, and an $Al_zGa_{1-z}N$ adjustment layer containing p-type impurity, which has an approximately equal Al composition to the first $Al_xGa_{1-x}N$ layer ($x-0.05 \le z \le x+0.05$, $0 \le z < 1$) is provided between the buffer and the functional laminate, wherein the buffer includes an $Al_\alpha Ga_{1-\alpha}N$ layer ($0 < \alpha \le 1$) at an outmost portion of the buffer on the functional laminate side, and difference between an Al composition $\alpha$ of the $Al_\alpha Ga_{1-\alpha}N$ layer and an Al composition x of the first $Al_xGa_{1-x}N$ layer is 0.1 or more.

2. The semiconductor device according to claim 1, wherein the substrate is an AlN template substrate.

3. The semiconductor device according to claim 1, wherein the first $Al_xGa_{1-x}N$ layer is n-type, and
the functional laminate includes at least a light emitting layer and a second $Al_yGa_{1-y}N$ layer ($0 \le y < 1$) in this order on the first $Al_xGa_{1-x}N$ layer.

4. The semiconductor device according to claim 1, wherein an i-type $Al_wGa_{1-w}N$ layer ($x-0.05w \le x+0.05$, $0 \le w < 1$) not doped with impurity is further provided between the $Al_zGa_{1-z}N$ adjustment layer containing p-type impurity and the first $Al_xGa_{1-x}N$ layer.

5. The semiconductor device according to claim 4, wherein the $Al_zGa_{1-z}N$ adjustment layer containing p-type impurity and the i-type $Al_wGa_{1-w}N$ layer not doped with impurity satisfy the relationship of z<w.

6. The semiconductor device according to claim 1, wherein a thickness of the $Al_zGa_{1-z}N$ adjustment layer containing p-type impurity is in a range of 100 nm to 1500 nm.

7. The semiconductor device according to claim 1, wherein the $Al_zGa_{1-z}N$ adjustment layer containing p-type impurity is doped with Mg, and the Mg concentration is in a range of $5\times10^{16}/cm^3$ to $2\times10^{20}/cm^3$.

8. The semiconductor device according to claim 1, wherein a concentration of O contained in the first $Al_xGa_{1-x}N$ layer is less than $2\times10^{18}/cm^3$.

9. The semiconductor device according to claim 1, wherein the buffer includes a superlattice strain buffer layer having a superlattice structure formed by alternately stacking $Al_\beta Ga_{1-\beta}N$ layers ($0 \le \beta \le 0.3$) and AlN layers.

10. The semiconductor device according to claim 9, wherein the $Al_\beta Ga_{1-\beta}N$ layers contain a p-type impurity.

11. The semiconductor device according to claim 9, wherein an average impurity concentration of the whole superlattice strain buffer layer is $1\times10^{18}/cm^3$ or less.

12. A method of producing a semiconductor device, wherein a buffer, an $Al_zGa_{1-z}N$ adjustment layer containing p-type impurity ($x-0.05 \le z \le x+0.05$, $0 \le z < 1$), and a functional laminate including an i-type or n-type $Al_xGa_{1-x}N$ layer ($0 \le x < 1$) are sequentially formed on a substrate, wherein the buffer includes an $Al_\alpha Ga_{1-\alpha}N$ layer ($0<\alpha\leq1$) at an outmost portion of the buffer on the functional laminate side, and difference between an Al composition $\alpha$ of the $Al_\alpha Ga_{1-\alpha}N$ layer and an Al composition x of the first $Al_x Ga_{1-x}N$ layer is 0.1 or more.

* * * * *